(12) United States Patent
Ning

(10) Patent No.: US 10,985,191 B2
(45) Date of Patent: Apr. 20, 2021

(54) DISPLAY PANEL AND DISPLAY DEVICE

(71) Applicant: Shanghai AVIC OPTO Electronics Co., Ltd., Shanghai (CN)

(72) Inventor: Junpeng Ning, Wuhan (CN)

(73) Assignee: SHANGHAI AVIC OPTO ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 16/557,356

(22) Filed: Aug. 30, 2019

(65) Prior Publication Data

US 2020/0328231 A1  Oct. 15, 2020

(30) Foreign Application Priority Data

Apr. 12, 2019 (CN) .......................... 201910294532.3

(51) Int. Cl.
*H01L 27/12* (2006.01)

(52) U.S. Cl.
CPC .................. *H01L 27/124* (2013.01)

(58) Field of Classification Search
CPC ............. G09G 3/3266; G09G 3/3275; G09G 2300/0809; G09G 3/3258; G09G 2300/0426; G02F 1/134363; G02F 1/13452
See application file for complete search history.

(56) References Cited

U.S. PATENT DOCUMENTS

| | | | | |
|---|---|---|---|---|
| 2017/0337876 | A1* | 11/2017 | Kim | G09G 3/3266 |
| 2018/0129106 | A1* | 5/2018 | Gao | G09G 3/3611 |
| 2019/0019789 | A1* | 1/2019 | Kim | H01L 27/0248 |
| 2019/0130840 | A1* | 5/2019 | Park | G09G 3/3266 |
| 2019/0157630 | A1* | 5/2019 | Kwon | H01L 51/5203 |

FOREIGN PATENT DOCUMENTS

| | | |
|---|---|---|
| CN | 107221536 A | 9/2017 |
| CN | 107742481 A | 2/2018 |
| CN | 109377882 A | 2/2019 |

* cited by examiner

*Primary Examiner* — Changhyun Yi
(74) *Attorney, Agent, or Firm* — Anova Law Group PLLC

(57) ABSTRACT

Display panel and display device are provided. The display panel includes a display region, a non-display region surrounding the display region, at least one notch, gate lines, data lines, and first compensation parts. The non-display region includes a first non-display region surrounding the at least one notch. The gate lines include first gate lines. Each of the first gate lines includes a second wiring portion in the first non-display region. The data lines include first data lines. Each of the first data lines includes a second sub-portion and a third sub-portion in the first non-display region. Along a direction perpendicular to a plane of the display panel, the third sub-portions overlap the second wiring portions, and the first compensation parts overlap the second wiring portions and the first data lines. Overlapping portions between the first compensation parts, the second wiring portions, and the first data lines form first compensation units.

20 Claims, 15 Drawing Sheets

DISPLAY PANEL AND DISPLAY DEVICE

CROSS-REFERENCES TO RELATED APPLICATION

This application claims the priority of Chinese Patent Application No. 201910294532.3, filed on Apr. 12, 2019, the content of which is incorporated herein by reference in its entirety.

TECHNICAL FIELD

The present disclosure generally relates to the field of display technology and, more particularly, relates to a display panel and a display device.

BACKGROUND

As display technologies develop, irregular-shaped display panels are more and more widely used. An irregular-shaped display panel is a display panel with an irregular shape based on a regular-shaped display panel. Currently, the irregular-shaped display panel mainly has a fan-shaped, an arc-shaped, a circular, a triangular, or another structural form.

In the irregular-shaped display panel, a display region has an irregular shape and signal lines in the display region have different length. Correspondingly, a number of the pixel units driven by different signal lines in the display region of the display panel is different, and loads of corresponding signal lines are different. A degree of attenuation of signals transmitted on the signal lines is different and display performance of the display panel is affected adversely.

There is a need to solve technical problems to provide a display panel and a display device with good performance.

SUMMARY

One aspect of the present disclosure provides a display panel. The display panel includes a display region, a non-display region surrounding the display region, at least one notch, a plurality of gate lines, a plurality of data lines, and a plurality of first compensation parts. The display region includes a first edge portion. The first edge portion includes a first sub-edge portion and the first sub-edge portion is recessed toward an inside of the display region to form the at least one notch. A portion of the first edge portion except the first sub-edge portion extends along a first direction. The non-display region includes a first non-display region surrounding the at least one notch. The plurality of gate lines includes first gate lines. Each of the first gate lines includes a first wiring portion and a second wiring portion connected to each other. The first wiring portions are disposed in the display region and extend along the first direction. The second wiring portions are disposed in the first non-display region. The plurality of data lines includes first data lines. Each of the first data lines includes a first sub-portion, a second sub-portion, and a third sub-portion connected to each other. The first sub-portions are disposed in the display region, while the second sub-portions and the third sub-portions are disposed in the first non-display region. The first sub-portions and the second sub-portions extend along a second direction wherein the second direction intersects the first direction. The third sub-portions extend along a direction same as an extending direction of the second wiring portions. Along a direction perpendicular to a plane of the display panel, the third sub-portions overlap the second wiring portions. The plurality of first compensation parts disposed in the first non-display region is made of a semi-conductive material and is insulated from each other. Along the direction perpendicular to the plane of the display panel, the plurality of first compensation parts overlaps the second wiring portions and the first data lines. Overlapping portions between the plurality of first compensation parts, the second wiring portions, and the first data lines form first compensation units.

Another aspect of the present disclosure provides a display device. The display device includes a display panel provided by various embodiments of the present disclosure. The display panel includes a display region, a non-display region surrounding the display region, at least one notch, a plurality of gate lines, a plurality of data lines, and a plurality of first compensation parts. The display region includes a first edge portion. The first edge portion includes a first sub-edge portion and the first sub-edge portion is recessed toward an inside of the display region to form the at least one notch. A portion of the first edge portion except the first sub-edge portion extends along a first direction. The non-display region includes a first non-display region surrounding the at least one notch. The plurality of gate lines includes first gate lines. Each of the first gate lines includes a first wiring portion and a second wiring portion connected to each other. The first wiring portions are disposed in the display region and extend along the first direction. The second wiring portions are disposed in the first non-display region. The plurality of data lines includes first data lines. Each of the first data lines includes a first sub-portion, a second sub-portion, and a third sub-portion connected to each other. The first sub-portions are disposed in the display region, while the second sub-portions and the third sub-portions are disposed in the first non-display region. The first sub-portions and the second sub-portions extend along a second direction wherein the second direction intersects the first direction. The third sub-portions extend along a direction same as an extending direction of the second wiring portions. Along a direction perpendicular to a plane of the display panel, the third sub-portions overlap the second wiring portions. The plurality of first compensation parts disposed in the first non-display region is made of a semi-conductive material and is insulated from each other. Along the direction perpendicular to the plane of the display panel, the plurality of first compensation parts overlaps the second wiring portions and the first data lines. Overlapping portions between the plurality of first compensation parts, the second wiring portions, and the first data lines form first compensation units.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
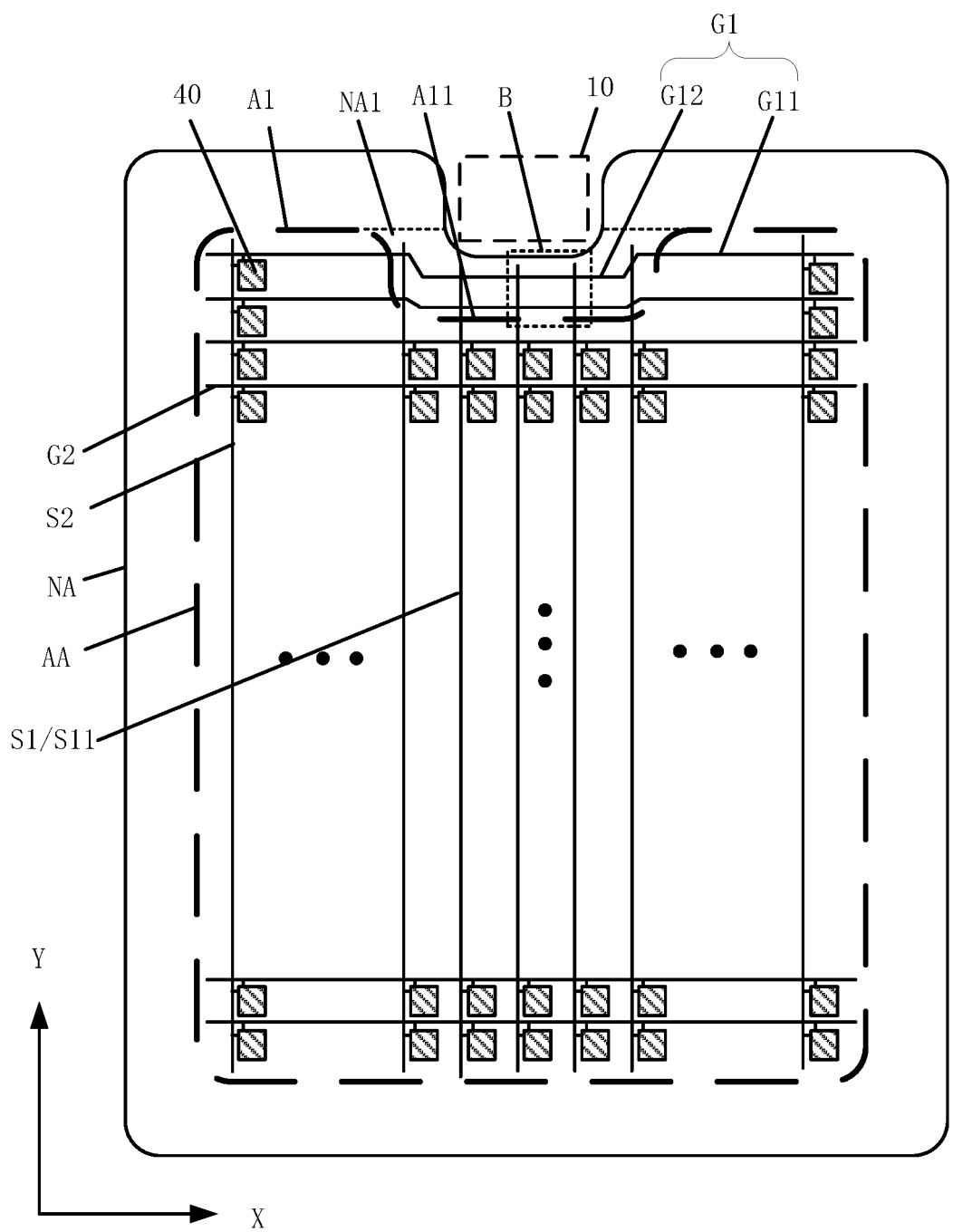
FIG. 1 illustrates an exemplary display panel consistent with various disclosed embodiments in the present disclosure.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Moreover, the present disclosure is described with reference to schematic diagrams. For the convenience of descriptions of the embodiments, the cross-sectional views illustrating the device structures may not follow the common proportion and may be partially exaggerated. Besides, those schematic diagrams are merely examples, and not intended to limit the scope of the disclosure. Furthermore, a three-dimensional (3D) size including length, width and depth should be considered during practical fabrication.

Figure 2:
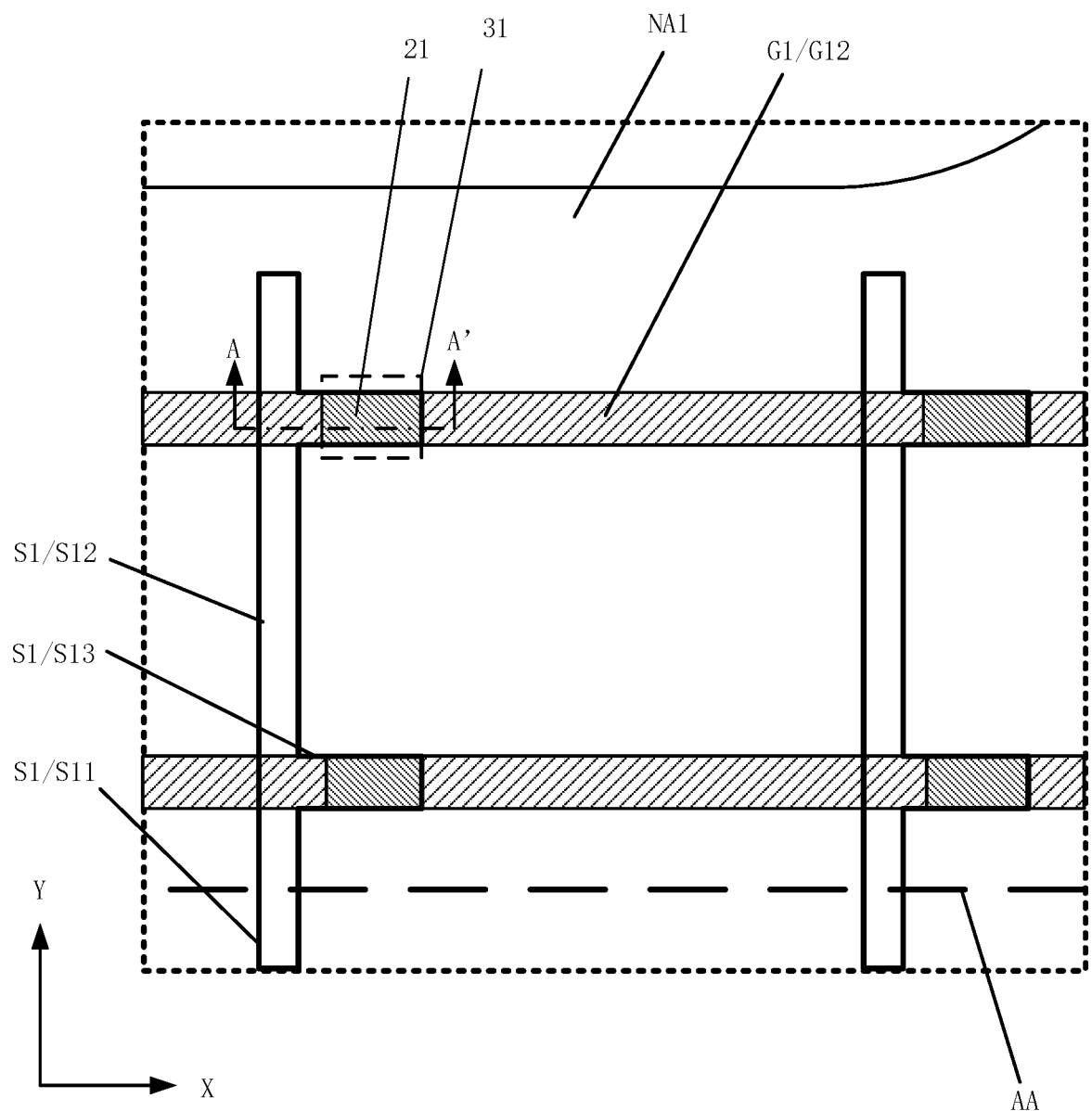
FIG. 2 illustrates an enlarged view of a B part of the display panel in FIG. 1.
Figure 3:
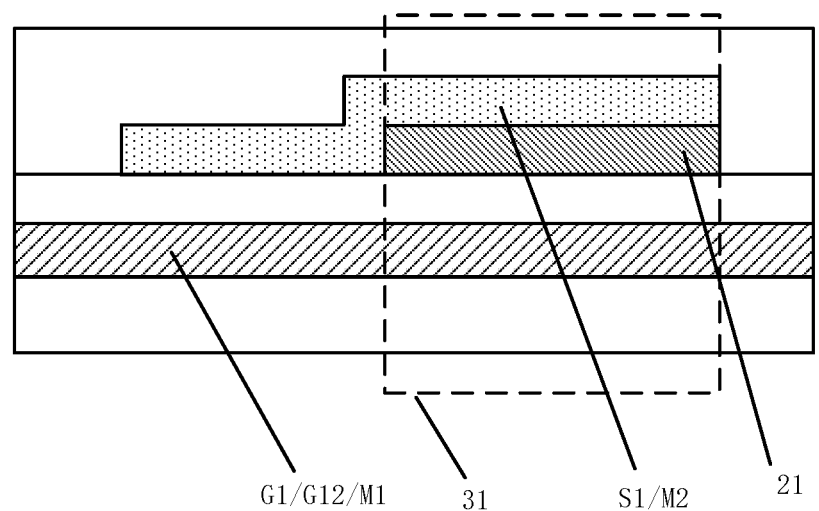
FIG. 3 illustrates a cross-sectional view of the display panel in FIG. 2 along an A-A' direction.

FIG. 1 illustrates an exemplary display panel consistent with various disclosed embodiments in the present disclosure, FIG. 2 illustrates an enlarged view of a part B of the display panel in FIG. 1, and FIG. 3 illustrates a cross-sectional view of the display panel in FIG. 2 along an A-A' direction. As illustrated in FIGS. 1-3, in one embodiment, the display panel may include a display region AA, a non-display region NA surrounding the display region AA, at least one notch 10, a plurality of gate lines G, a plurality of data lines S, a plurality of compensation parts 21. The display region AA may include a first edge portion A1 and the first edge portion A1 may include a first sub-edge portion A11. The first sub-edge portion A11 may be recessed toward an inside of the display region AA to form the at least one notch 10. A remaining portion of the first edge portion A1 except the first sub-edge portion A11 may extend along a first direction X.

The non-display region NA may include a first non-display region NA1 and the first non-display region NA1 may be disposed surrounding the at least one notch 10.

The plurality of gate lines G may include first gate lines G1. Each of the first gate lines G1 may include a first wiring portion G11 and a second wiring portion G12. The first line portion G11 may be disposed in the display region AA and may extend along the first direction X. The second wiring portion G12 may be disposed in the first non-display region NA1.

The plurality of data lines S may include first data lines S1. Each of the first data lines S1 may include a first sub-portion S11, a second sub-portion S12 and a third sub-portion S13. The first sub-portions S11 may be disposed in the display region AA. The second sub-portions S12 and the third sub-portions S13 may be disposed in the first non-display region NA1. The first sub-portions S11 and the second sub-portions S12 may extend along a second direction Y, while the third sub-portions S13 may extend along a direction same as an extending direction of the second wiring portions G12. Along a direction perpendicular to the display panel, each of the third sub-portions S13 may overlap corresponding one of the second wiring portions G12. The first direction X may intersect the second direction Y.

The plurality of compensation parts 21 may be disposed in the first non-display region NA1, and may be made of a semiconductive material. Each of the plurality of compensation parts 21 may be insulated from each other.

Along the direction perpendicular to the display panel, each of the plurality of compensation parts 21 may overlap corresponding one of the second line portions G12 and overlap corresponding one of the plurality of first data lines S1. An overlap part between each of the plurality of compensation parts 21, the corresponding one of the second line portions G12 and the corresponding one of the plurality of first data lines S1 may form a first compensation unit 31.

In one embodiment, as illustrated in FIGS. 1-3, the display region AA may have a display function. Circuit elements, lines, and other structures may be disposed in the non-display region NA. The non-display region NA may not have a display function.

The display panel provided by the embodiments of the present disclosure may be an irregular-shaped display panel. The display panel may include the at least one notch 10 and the display region AA may not be a rectangle extending continuously. For description purposes only, the embodiments with one notch 10 will be used as examples to illustrate the present disclosure, and should not limit scopes of the present disclosure, and should not limit the scopes of the present disclosure. In some other embodiments, the display panel may include two or more notches.

The notch 10 may be a notch formed by recessing the first sub-edge portion A11 toward an inside of the display region AA, or a hole in the display region AA. Since the non-display region NA may surround the display region AA, the non-display region NA may include the first non-display region NA1 with a shape that is adapted to the shape of the notch 10. The first non-display region NA1 may be disposed surrounding the at least one notch 10.

The display panel may include the plurality of gate lines G and the plurality of data lines S. The plurality of gate lines G may include first gate lines G1. The second wiring portions G12 of the first gate lines G1 may be disposed in the first non-display region NA1. The plurality of data lines S may include first data lines S1. The second sub-portions S12 and the third sub-portions S13 of the first data lines S1 may be disposed in the first non-display region NA1. The plurality of compensation parts 21 may be disposed in the first non-display region NA1, and may be made of a semiconductive material. Each of the plurality of compensation parts 21 may be insulated from each other. Along the direction perpendicular to the display panel, the plurality of compensation parts 21 may overlap the second line portions G12 and the plurality of first data lines S1. Overlapping portions between the plurality of compensation parts 21, the second line portions G12 and the plurality of first data lines S1 may form the first compensation units 31. In each of the first compensation units 31, when the corresponding one of the second wiring portions G12 transmits voltage signals, induced charges may be generated at a surface of corresponding one of the first compensation parts 21, and the surface of the corresponding one of the first compensation parts 21 may be converted from a depletion layer to an electron accumulation layer, to form an inversion layer. Correspondingly, the corresponding one of the first compensation parts 21 may have a certain carrier concentration and may be conductive. The deployment of the first compensation units 31 may increase loads of the first gate lines G1 and the first data lines S1. Then a difference of the loads in the display panel and a difference of the scan delay in the display panel may be reduced by disposing the first compensation units 31 in the first non-display region NA1. A displaying uniformity of the display panel and then a product quality may be improved. When one of the second wiring portions 12 transmits or does not transmit voltage signals, the loads formed on the corresponding one of the first compensation units 31 may be different. Correspondingly, the loads may be adjusted through the first compensation units 31 according to whether the second wiring portions 12 transmit or do not transmit voltage signals. Then a difference of the loads in the display panel and a difference of the scan delay in the display panel may be reduced further. A displaying uniformity of the display panel and then a product quality may be improved further.

Figure 4:
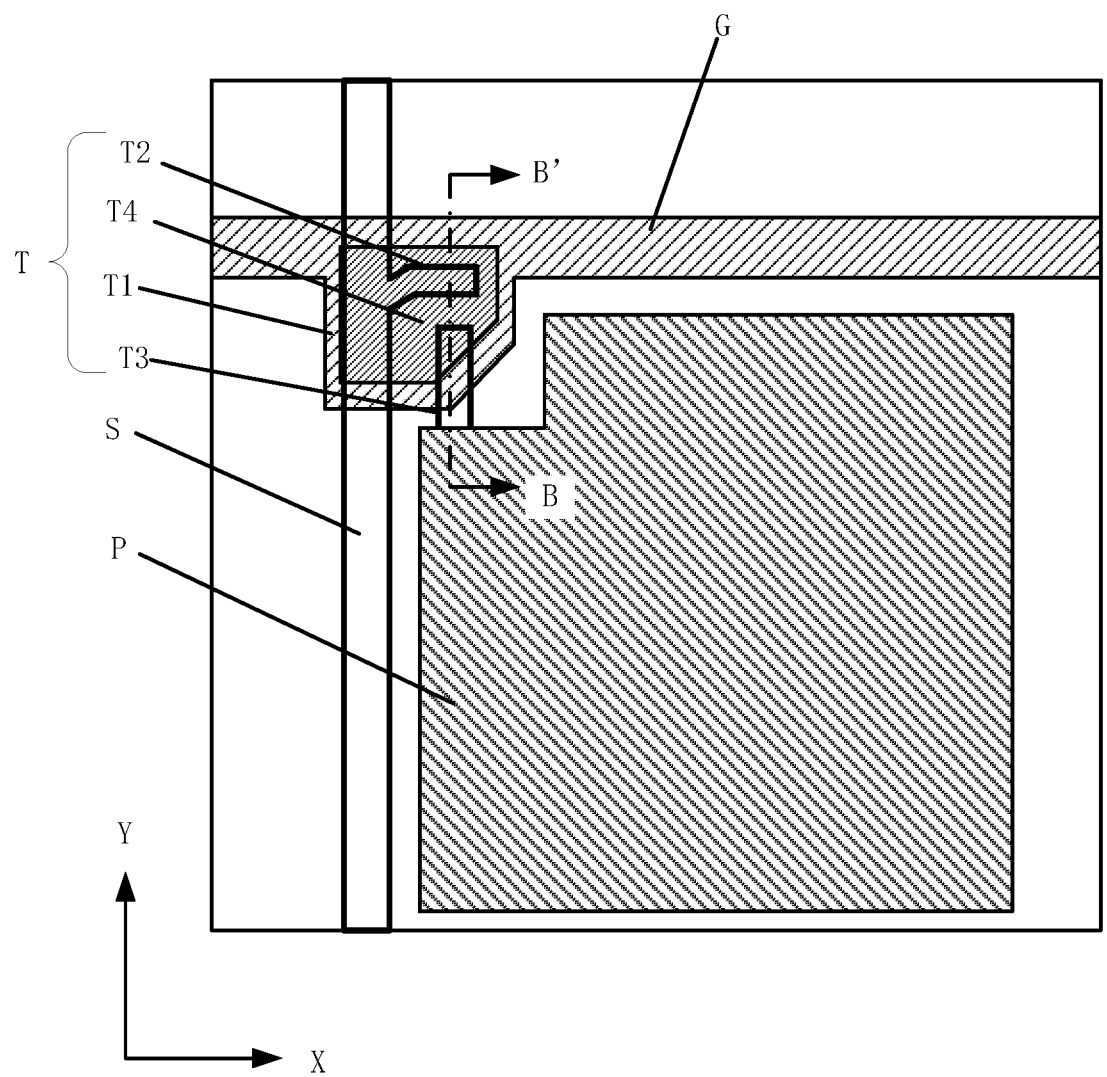
FIG. 4 illustrates an exemplary pixel unit of an exemplary display panel consistent with various disclosed embodiments in the present disclosure.
Figure 5:
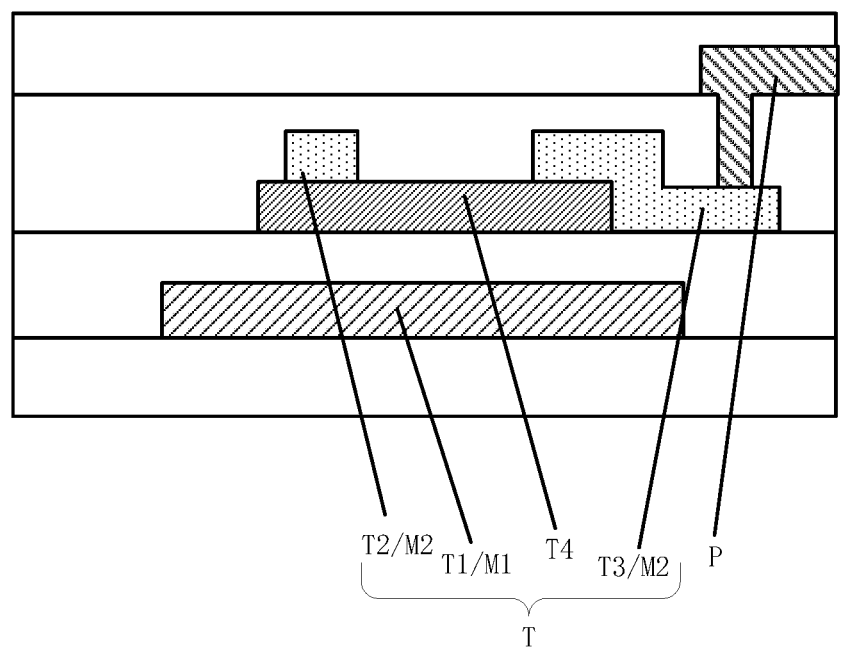
FIG. 5 illustrates a cross-sectional view of the pixel unit in FIG. 4 along a B-B' direction.

FIG. 4 illustrates an exemplary pixel unit of an exemplary display panel consistent with various disclosed embodiments in the present disclosure; and FIG. 5 illustrates a cross-sectional view of the pixel unit in FIG. 4 along a B-B' direction. In one embodiment, as illustrated in FIGS. 1-5, the display panel may further include a plurality of pixel units 40 arranged in an array. The plurality of pixel units 40 may be disposed in the display region AA.

The plurality of gate lines G may further include second gate lines G2 extending along the first direction X. The second gate lines G2 may be disposed in the display region AA.

The plurality of data lines S may further include second data lines S2 extending along the second direction Y. Along the direction perpendicular to the display panel, the second data lines S2 may overlap the first wiring portions G11.

Each of the plurality of pixel units 40 may be electrically connected to at least one of the second gate lines G2 or to at least one of the first wiring portions G11. Each of the plurality of pixel units 40 may be electrically connected to at least one of the second data lines S2 or to at least one of the first sub-portions S11.

Each of the plurality of pixel units 40 may include a thin film transistor T and a pixel electrode P. The thin film transistor T may include a gate T1, a source T2, a drain T3, and an active layer T4. The source T2 may be electrically connected to the data lines S. The gate T1 may be electrically connected to the gate lines G, and the drain T3 may be electrically connected to the pixel electrode P.

In one embodiment, the display panel may include the plurality of pixel units 40 in the display region AA. Each of the plurality of pixel units 40 may be electrically connected to at least one of the second gate lines G2 or to at least one of the first wiring portions G11. Each of the plurality of pixel units 40 may be electrically connected to at least one of the second data lines S2 or to at least one of the first sub-portions S11. The plurality of pixel units 40 may not be disposed in the first non-display region NA1. A number of the plurality of pixel units 40 connected to the first gate lines G1 may be different from a number of the plurality of pixel units 40 connected to the second gate lines G2.

Each of the plurality of pixel units 40 may include the thin film transistor T and the pixel electrode P. The thin film transistor T may include the gate T1, the source T2, the drain T3, and the active layer T4. The source T2 may be electrically connected to the data lines S. The gate T1 may be electrically connected to the gate lines G, and the drain T3 may be electrically connected to the pixel electrode P. When one of the plurality of gate lines G transmits voltage signals, the corresponding gate T1 may have voltage signals too, and induced charges may be generated at a surface of the corresponding active layer T4 opposite to the corresponding gate T1. The surface of the corresponding active layer T4 may be converted from a depletion layer to an electron accumulation layer, to form an inversion layer. Correspondingly, the corresponding active layer T4 may have a certain carrier concentration and may be conductive to connect the corresponding source T2 to the corresponding drain T3. The corresponding pixel electrode P may be charged and/or discharged through the data lines S. A load of one of the first compensation units 31 when the corresponding one of the second wiring portions G12 electrically connected the one of the first compensation units 31 transmits voltage signals may be close to a load of the corresponding thin film transistor T when the corresponding one of the plurality of gate lines G electrically connected the thin film transistor T transmits voltage signals. The load of one of the first compensation units 31 when the corresponding one of the second wiring portions G12 electrically connected the one of the first compensation units 31 does not transmit voltage signals may be close to the load of the corresponding thin film transistor T when the corresponding one of the plurality of gate lines G electrically connected the thin film transistor T does not transmit voltage signals. A difference of the loads in the display panel and a difference of the scan delay in the display panel because a difference between a number of the thin film transistors T connected to the first gate lines G1 and a number of the thin film transistors connected to the second gate lines G2 may be reduced by disposing the first compensation units 31 in the first non-display region NA1. A displaying uniformity of the display panel and then a product quality may be improved.

In one embodiment, as illustrated in FIGS. 1-5, the display panel may further include a first metal layer M1 and a second metal layer M2. The plurality of gate lines G and the gates T1 may be disposed on the first metal layer M1. The sources T2, the drains T3, and the plurality of data lines S may be disposed on the second metal layer M2. The active layers T4 may be disposed between the first metal layer M1 and the second metal layer M2. For description purposes only, the embodiment where the active layers T4 are disposed between the first metal layer M1 and the second metal layer M2 is used as examples to illustrate the present disclosure, and should not limit scopes of the present disclosure, and should not limit the scopes of the present disclosure. In various embodiments, the active layers T4 may be disposed at any suitable positions according to needs of the actual production. For example, the active layers T4 are disposed between the first metal layer M1 and a substrate plate, or at other film layers of the display panel.

In one embodiment, the plurality of first compensation parts 21 and the active layers T4 may be made of same materials and may be disposed in a same layer. Since the plurality of first compensation parts 21 and the active layers T4 may be made of same materials, the difference between the loads of the first compensation units 31 and the loads of the thin film transistors T may be reduced further. The plurality of first compensation parts 21 and the active layers T4 may be disposed in a same layer. Correspondingly, the plurality of first compensation parts 21 and the active layers T4 may be formed by a same material in a same process. A process for forming the display panel may be simplified and a production cost may be reduced. For description purposes only, the embodiment where the plurality of first compensation parts 21 and the active layers T4 are made of same materials and/or are disposed in a same layer is used as examples to illustrate the present disclosure, and should not limit scopes of the present disclosure. In some other embodiments, the plurality of first compensation parts 21 and the active layers T4 may be made of different materials. In some other embodiments, the plurality of first compensation parts 21 and the active layers T4 may be disposed in different layers.

Figure 6:
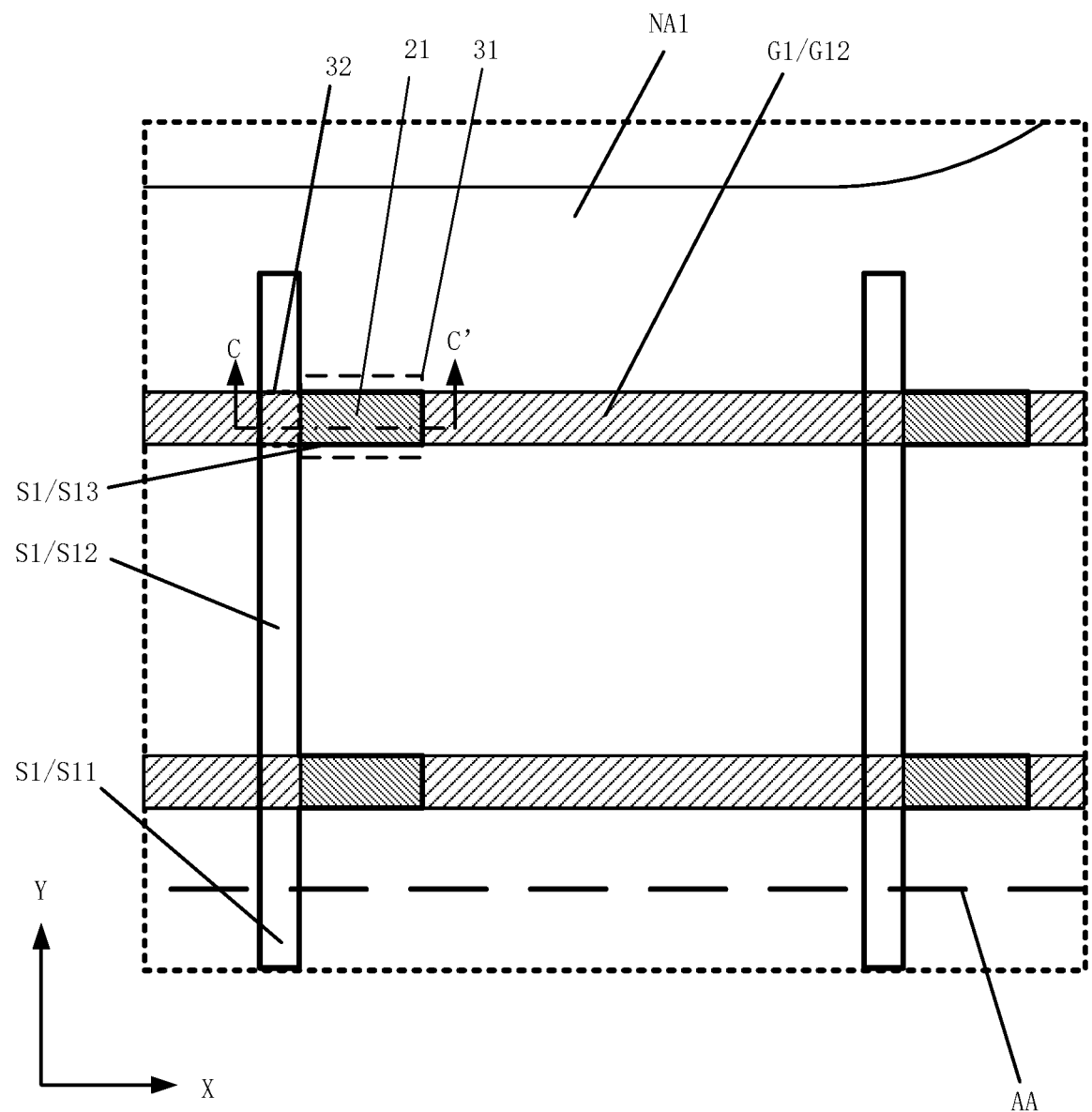
FIG. 6 illustrates another enlarged view of a B part of the display panel in FIG. 1.
Figure 7:
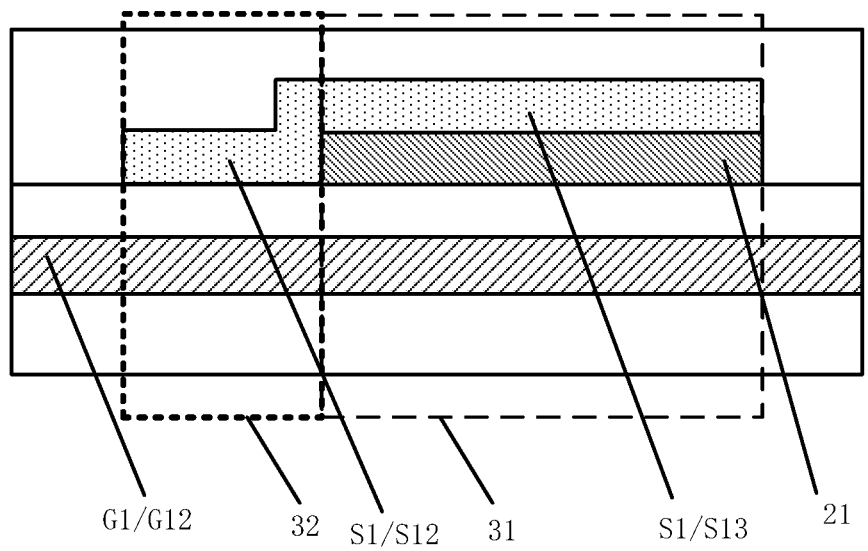
FIG. 7 illustrates a cross-sectional view of the display panel in FIG. 6 along a C-C' direction.

FIG. 6 illustrates another enlarged view of a B part of the display panel in FIG. 1; and FIG. 7 illustrates a cross-sectional view of the display panel in FIG. 6 along a C-C' direction. In one embodiment, as illustrated in FIG. 1 and FIGS. 4-7, an orthographic projection of each of the plurality of first compensation parts 21 on the plane of the display panel may be located in an orthographic projection of corresponding one of the second wiring portions G12 on the plane of the display panel and may be same as an orthographic projection of corresponding one of the third sub-portions S13 on the plane of the display panel.

Along the direction perpendicular to the plane of the display panel, the second sub-portions S12 may overlap the second wiring portions G12, and may not overlap the plurality of first compensation parts 21. Overlapping portions between the second sub-portions S12 and the second wiring portions G12 may form second compensation units 32.

In this embodiment, the orthographic projection of each of the plurality of first compensation parts 21 on the plane of the display panel may be located in the orthographic projection of corresponding one of the second wiring portions G12 on the plane of the display panel, and may be same as the orthographic projection of corresponding one of the third sub-portions S13 on the plane of the display panel. The overlapping portions between the plurality of first compensation units 21, the second wiring portions G12 and the third sub-portions S13 may form the first compensation units 31. The second sub-portions S12 may overlap the second wiring portions G12, and may not overlap the plurality of first compensation parts 21. The overlapping portions between the second sub-portions S12 and the second wiring portions G12 may form the second compensation units 32.

The loads of the second compensation units 32 may be close to loads formed by a portion of the sources T2 overlapping the plurality of gate lines G or the gate but not overlapping the active layers T4 in the meantime along the direction perpendicular to the display panel. A difference of the loads in the display panel and a difference of the scan delay in the display panel because of a difference between a number of the thin film transistors T connected to the first gate lines G1 and a number of the thin film transistors connected to the second gate lines G2 may be reduced further by disposing the second compensation units 32. A displaying uniformity of the display panel and then a product quality may be improved further.

Figure 8:
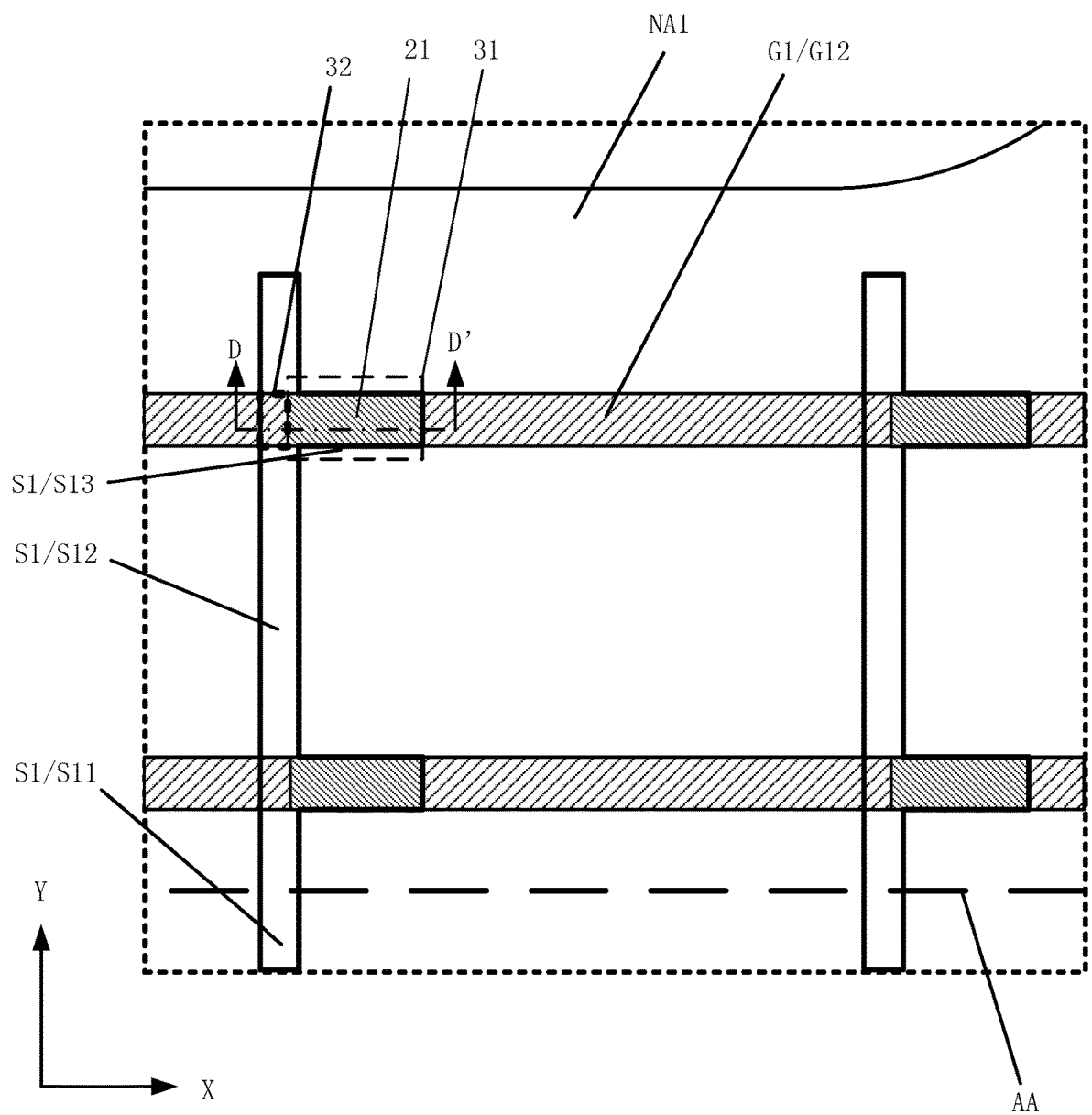
FIG. 8 illustrates another enlarged view of a B part of the display panel in FIG. 1.
Figure 9:
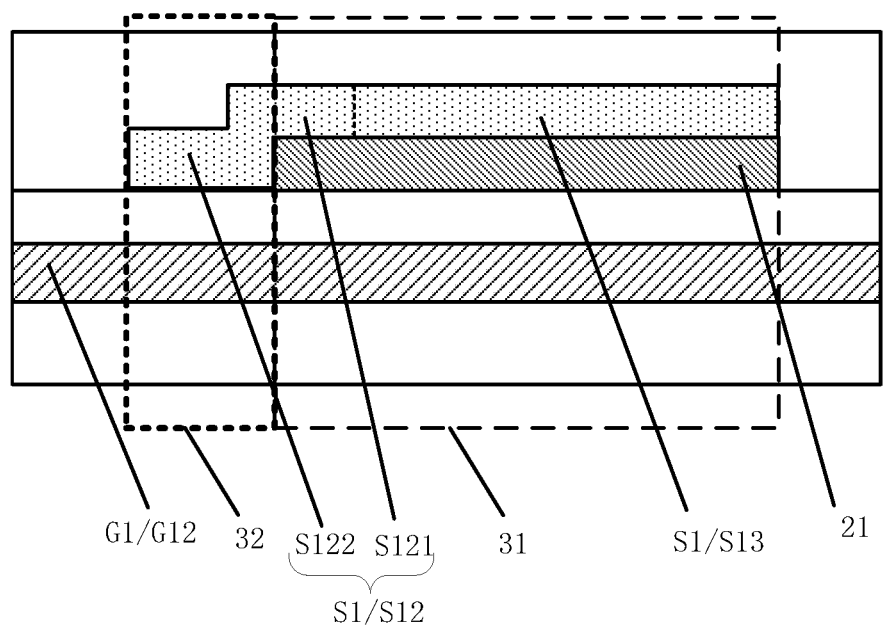
FIG. 9 illustrates a cross-sectional view of the display panel in FIG. 8 along a D-D' direction.

FIG. 8 illustrates another enlarged view of a B part of the display panel in FIG. 1; and FIG. 9 illustrates a cross-sectional view of the display panel in FIG. 8 along a D-D' direction. In one embodiment, as illustrated in FIG. 1, FIGS. 4-5 and FIGS. 8-9, an orthographic projection of each of the plurality of first compensation parts 21 on the plane of the display panel may be located in an orthographic projection of corresponding one of the second wiring portions G12 on the plane of the display panel and an orthographic projection of each of the third sub-portions S13 on the plane of the display panel may be located in an orthographic projection of corresponding one of the plurality of first compensation parts 21 on the plane of the display panel.

Each of the second sub-portions S12 may include a first subsection S121 and a second subsection S122. Along the direction perpendicular to the plane of the display panel, the plurality of first compensation parts 21 may overlap the first subsections S121, and the second subsections S122 may overlap the second wiring portions G12. The second subsection S122 may not overlap the plurality of first compensation parts 21. Overlapping areas between the second subsections S122 and the second wiring portions G12 may form second compensation units 32.

In this embodiment, an orthographic projection of each of the plurality of first compensation parts 21 on the plane of the display panel may be located in an orthographic projection of corresponding one of the second wiring portions G12 on the plane of the display panel and an orthographic projection of each of the third sub-portions S13 on the plane of the display panel may be located in an orthographic projection of corresponding one of the plurality of first compensation parts 21 on the plane of the display panel. Along the direction perpendicular to the plane of the display panel, the plurality of first compensation parts 21 may overlap the first subsections S121 of the second sub-portions S12. The overlapping portions between the plurality of first compensation parts 21, the second wiring portions G12, and the third sub-portions S13, the overlapping portions between the first compensation parts 21, the second wiring portions G12 and the first subsections S121, may form the first compensation units 31. Along the direction perpendicular to the plane of the display panel, the second subsections S122 may overlap the second wiring portions G12. The second subsection S122 may not overlap the plurality of first compensation parts 21. The overlapping areas between the second subsections S122 and the second wiring portions G12 may form second compensation units 32. The loads of the second compensation units 32 may be close to loads formed by a portion of the sources T2 overlapping the plurality of gate lines G or the gate but not overlapping the active layers T4 in the meantime along the direction perpendicular to the display panel. A difference of the loads in the display panel and a difference of the scan delay in the display panel because of a difference between a number of the thin film transistors T connected to the first gate lines G1 and a number of the thin film transistors connected to the second gate lines G2 may be reduced further by disposing the second compensation units 32. A displaying uniformity of the display panel and then a product quality may be improved further.

Figure 10:
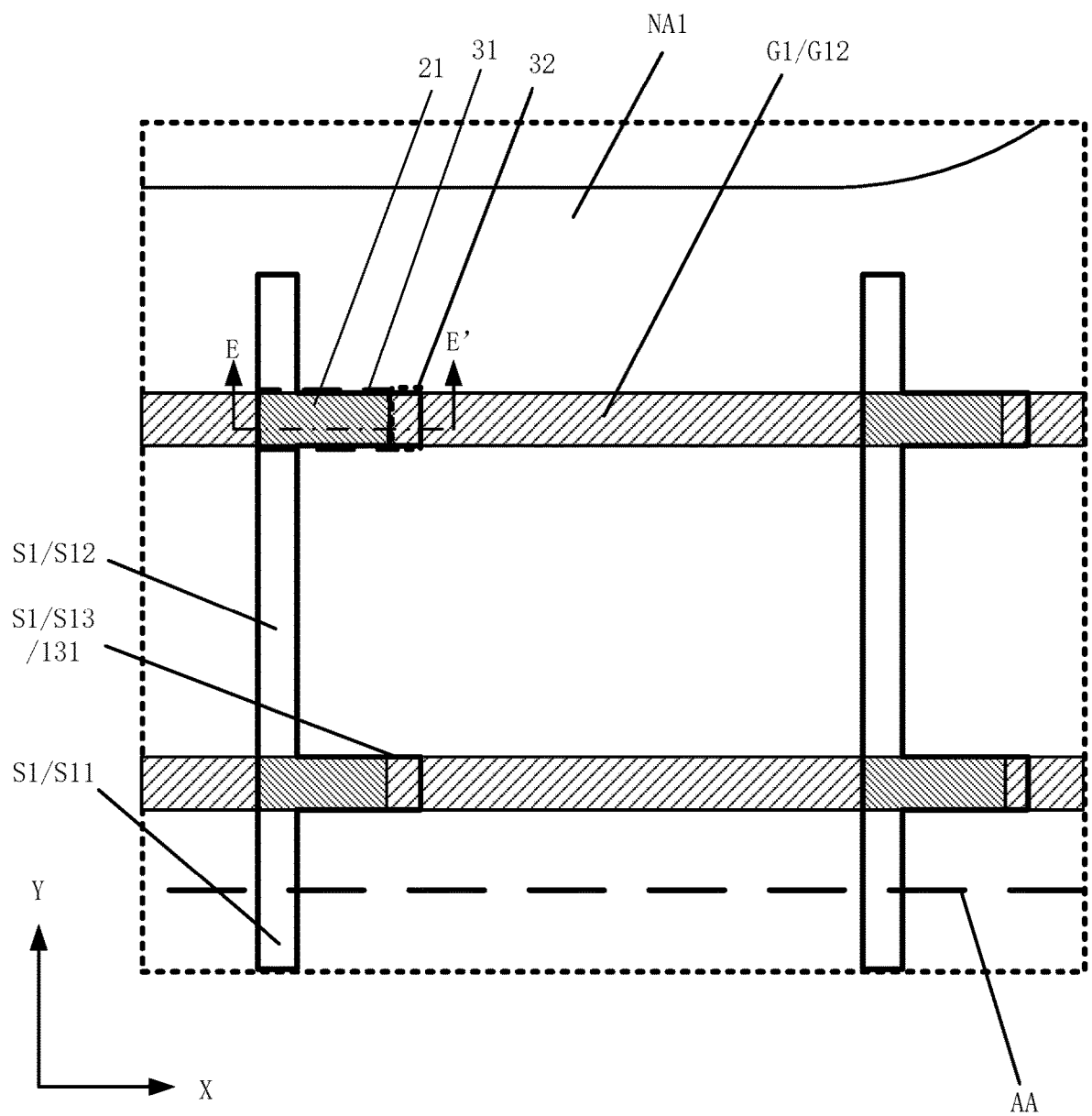
FIG. 10 illustrates another enlarged view of a B part of the display panel in FIG. 1.
Figure 11:
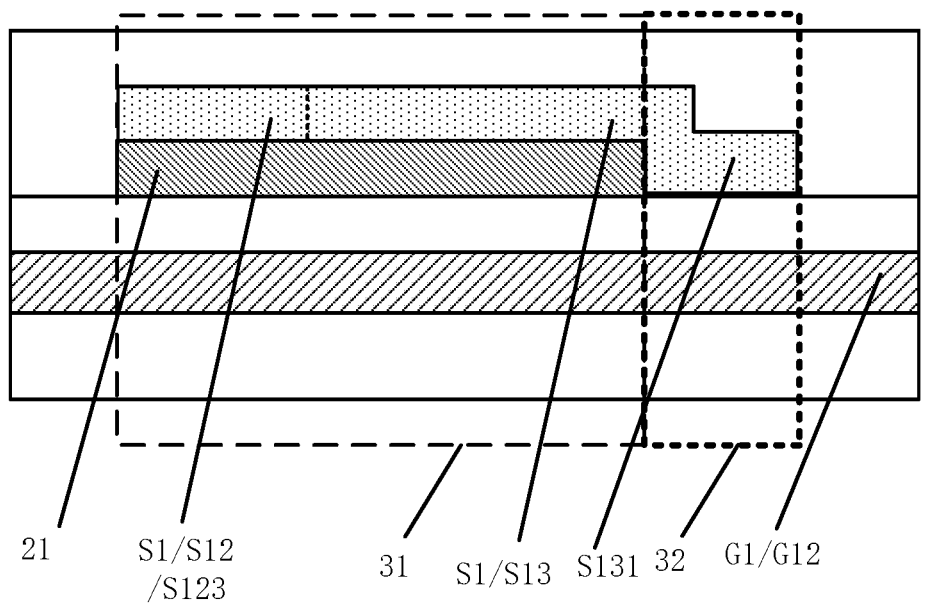
FIG. 11 illustrates a cross-sectional view of the display panel in FIG. 10 along an E-E' direction.

FIG. 10 illustrates another enlarged view of a B part of the display panel in FIG. 1; and FIG. 11 illustrates a cross-sectional view of the display panel in FIG. 10 along an E-E' direction. In one embodiment, as illustrated in FIG. 1, FIGS. 4-5 and FIGS. 10-11, an orthographic projection of each of the plurality of first compensation parts 21 on the plane of the display panel may be located in an orthographic projection of corresponding one of the second wiring portions G12 on the plane of the display panel. Each of the second sub-portions S12 may include a third subsection S123, and an orthographic projection of each of the third subsection S123 on the plane of the display panel may be located in an orthographic projection of corresponding one of the plurality of first compensation parts 21 on the plane of the display panel. Each of the third sub-portions S13 may include a fourth subsection S131. Along the direction perpendicular to the plane of the display panel, the fourth subsections S131 may overlap the second wiring portions G12 and may not overlap the plurality of first compensation parts 21. Overlapping portions between the fourth subsections S131 and the second wiring portions G12 may form second compensation units 32.

In the present embodiment, an orthographic projection of each of the plurality of first compensation parts 21 on the plane of the display panel may be located in an orthographic projection of corresponding one of the second wiring portions G12 on the plane of the display panel, and an orthographic projection of each of the third subsection S123 on the plane of the display panel may be located in an orthographic projection of corresponding one of the plurality of first compensation parts 21 on the plane of the display panel. The overlapping portions between the plurality of first compensation parts 21, the second wiring portions G12, and the third sub-portions S13, and the overlapping portions between the first compensation parts 21, the second wiring portions G12 and the third subsections S123, may form the first compensation units 31. Along the direction perpendicular to the plane of the display panel, the fourth subsections S131 may overlap the second wiring portions G12 and may not overlap the plurality of first compensation parts 21. The overlapping portions between the fourth subsections S131 and the second wiring portions G12 may form the second compensation units 32. The loads of the second compensation units 32 may be close to loads formed by a portion of the sources T2 overlapping the plurality of gate lines G or the gate but not overlapping the active layers T4 in the meantime along the direction perpendicular to the display panel. A difference of the loads in the display panel and a difference of the scan delay in the display panel because of a difference between a number of the thin film transistors T connected to the first gate lines G1 and a number of the thin film transistors connected to the second gate lines G2 may be reduced further by disposing the second compensation units 32. A displaying uniformity of the display panel and then a product quality may be improved further.

As illustrated in FIGS. 1-3, in one embodiment, along the second direction Y, a width of the plurality of first compensation parts 21, a width of the third sub-portions S13, and a width of the second wiring portions G12 may be same.

The overlapping portions between the plurality of first compensation parts 21, the second wiring portions G12 and the first data lines S1 may form the first compensation units 31. If a length of the plurality of first compensation parts 21 and a length of the third sub-portions S13 along an extending direction of the second wiring portions G12 are same but the width of the plurality of first compensation parts 21 and the width of the third sub-portions S13 are larger than the width of the second wiring portions G12, the formed first compensation units 31 may have an area same as an area of the first compensation unit 31 when the width of the plurality of first compensation parts 21, the width of the third sub-portions S13, and the width of the second wiring portions G12 are same. In this condition, signal interference may be more easily to happen between any two adjacent first compensation units 31 along the second direction Y if the width of the plurality of first compensation parts 21 and the width of the third sub-portions S13 are larger. The process for forming the plurality of first compensation parts 21 and the third sub-portions S13 may be harder if the width of the plurality of first compensation parts 21 and the width of the third sub-portions S13 are too small. In the present embodiment, the width of the plurality of first compensation parts 21, the width of the third sub-portions S13, and the width of the second wiring portions G12 are same, along the second direction Y. The process for forming the plurality of first compensation parts 21 and the third sub-portions S13 may be easy and a possibility of the signal interference between any two adjacent first compensation units 31 along the second direction Y may be suppressed.

Figure 12:
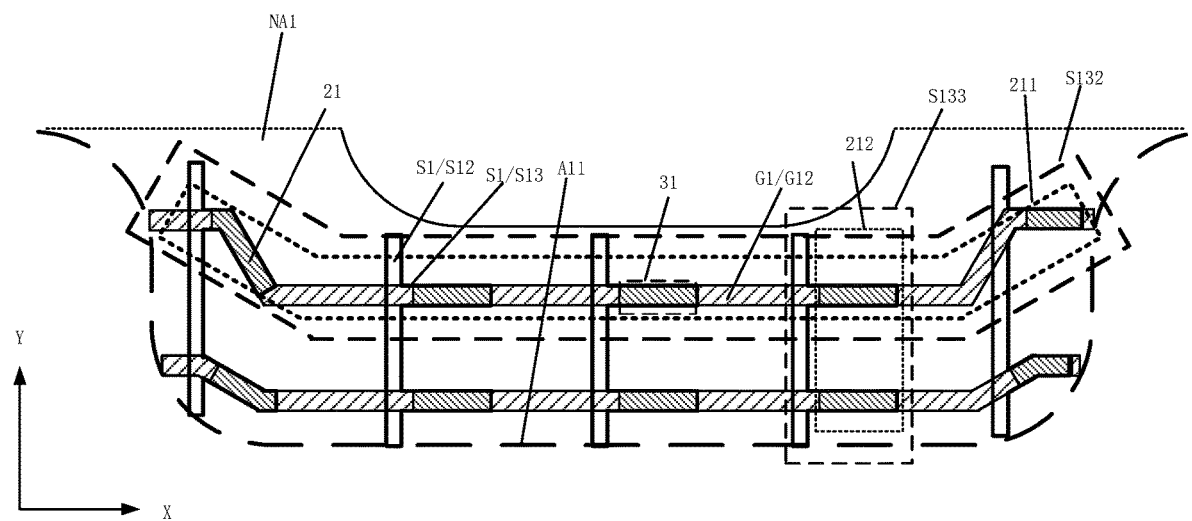
FIG. 12 illustrates an exemplary first non-display region of the display panel in FIG. 1.

FIG. 12 illustrates an exemplary first non-display region of the display panel in FIG. 1. As illustrated in FIG. 1, FIG. 4, FIG. 5 and FIG. 12, in one embodiment, the first non-display region NA1 in the display panel may include a plurality of third sub-part rows S132, a plurality of third sub-part columns 133, a plurality of first compensation-part rows 211 and a plurality of first compensation-part column 212.

Each of the plurality of third sub-part rows S132 may include a plurality of third sub-portions S13 arranged along the extending direction of the second wiring portions G12, and each of the plurality of third sub-part columns S133 may include a plurality of third sub-portions S13 arranged along the extending direction of the second sub-portions S12.

Each of the plurality of first compensation-part rows 211 may include a plurality of first compensation parts 21 arranged along the extending direction of the second wiring portions G12, and each of the plurality of first compensation-part columns 212 may include a plurality of third sub-portions S13 arranged along the extending direction of the second sub-portions S12.

A number of the plurality of third sub-part rows S132, a number of the plurality of first compensation-part rows 211, and a number of the second wiring portions G12 may be same.

A number of the plurality of third sub-part columns S133, a number of the plurality of first compensation-part columns 212, and a number of the second sub-portions S12 may be same.

In the present embodiment, the overlapping portions between the plurality of first compensation parts 21, the second wiring portions G12, and the first data lines S1 may form the first compensation units 31. The number of the plurality of third sub-part columns S133, the number of the plurality of first compensation-part columns 212, and the number of the second sub-portions S12 may be same. Correspondingly, a number of the first compensation units 31 on each of the second wiring portions G12 may be same as the number of the second sub-portions S12, and a number of the thin film transistors T connected to each of the second gate lines G2 may equal to a sum of a number of the thin film transistors T connected to each of the first gate lines G1 and a number of the first compensation units 31. Then the loads of the first compensation units 31 and the loads of the thin film transistors may be same. A difference of the loads and a difference of the scan delay in the first gate lines G1 and in the second gate lines G2 may be reduced further. A difference of the loads in the display panel and a difference of the scan delay in the display panel may be reduced further. A displaying uniformity of the display panel and then a product quality may be improved further.

In the present disclosure, the number of the plurality of third sub-part rows S132, the number of the plurality of first compensation-part rows 211, and the number of the second wiring portions G12 may be same. Correspondingly, a number of the first compensation units 31 on each of the first data lines S1 may be same as the number of the second wiring portions G12, and a number of the thin film transistors T connected to each of the second data lines S2 may equal to a sum of a number of the thin film transistors T connected to each of the first data lines S1 and a number of the first compensation units 31. Then the loads of the first compensation units and the loads of the thin film transistors may be same. A difference of the loads and a difference of the scan delay in the first data lines S1 and in the second data lines S2 may be reduced further. A difference of the loads in the display panel and a difference of the scan delay in the display panel may be reduced further. A displaying uniformity of the display panel and then a product quality may be improved further.

As illustrated in FIGS. 1-5, in one embodiment, in each of the thin film transistors T, along the direction perpendicular to the plane of the display panel, an orthographic projection of a portion of the active layer T4 overlapping the plurality of gate lines G or overlap the gate T1 and overlapping the plurality of data lines S or the source T2 simultaneously on the plane of the display panel may have an area S-1.

In each of the first compensation units 31, along the direction perpendicular to the plane of the display panel, the corresponding one of the plurality of first compensation parts 21 may overlap the corresponding one of the second wiring portions G12 and the corresponding one of the first data lines S1 simultaneously. An orthographic projection of a portion of the corresponding one of the plurality of first compensation parts 21 overlapping the corresponding one of the second wiring portions G12 and the corresponding one of the first data lines S1 simultaneously may have an area s1. In one embodiment, 0<S−1=s1.

In the present disclosure, a difference between the loads of the first compensation units 31 and the loads of the thin film transistors T may be reduced further. Correspondingly, a difference of the loads in the display panel and a difference of the scan delay in the display panel because of a difference between a number of the thin film transistors T connected to the first gate lines G1 and a number of the thin film transistors connected to the second gate lines G2 may be reduced further by disposing the first compensation units 31. A displaying uniformity of the display panel and then a product quality may be improved further.

As illustrated in FIG. 1 and FIGS. 4-7, in one embodiment, in each of the thin film transistors T, along the direction perpendicular to the plane of the display panel, an orthographic projection of a portion of the source T1 overlapping the plurality of gate lines G or overlap the gate T1 but not overlapping the active layer T4 on the display panel may have an area S-2.

In each of the second compensation units 32, along the direction perpendicular to the plane of the display panel, an orthographic projection of a portion of the corresponding one of the first data line S1 overlapping corresponding one of the second wiring portions G12 but not overlapping the corresponding one of the plurality of first compensation units 21 on the plane of the display panel may have an area s2. In one embodiment, 0<S−2=s2.

In the present disclosure, the loads of the second compensation units 32 may be close to the loads formed by a portion of the sources T1 overlapping the plurality of gate lines G or overlap the gate T1 but not overlapping the active layer T4. Correspondingly, a difference of the loads in the display panel and a difference of the scan delay in the display panel because of a difference between a number of the thin film transistors T connected to the first gate lines G1 and a number of the thin film transistors connected to the second gate lines G2 may be reduced further by disposing the second compensation units 32. A displaying uniformity of the display panel and then a product quality may be improved further.

Figure 13:
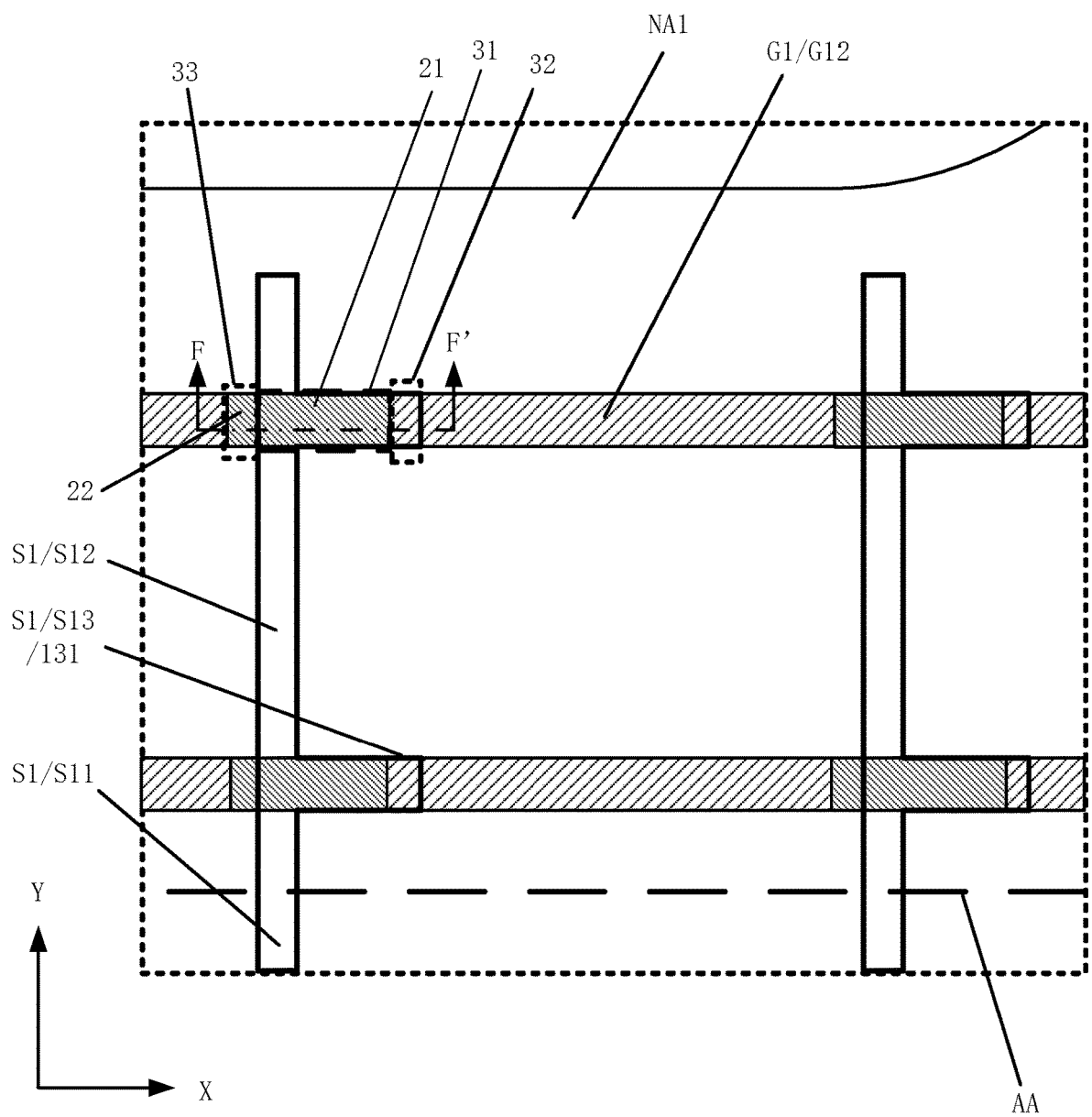
FIG. 13 illustrates another enlarged view of a B part of the display panel in FIG. 1.
Figure 14:
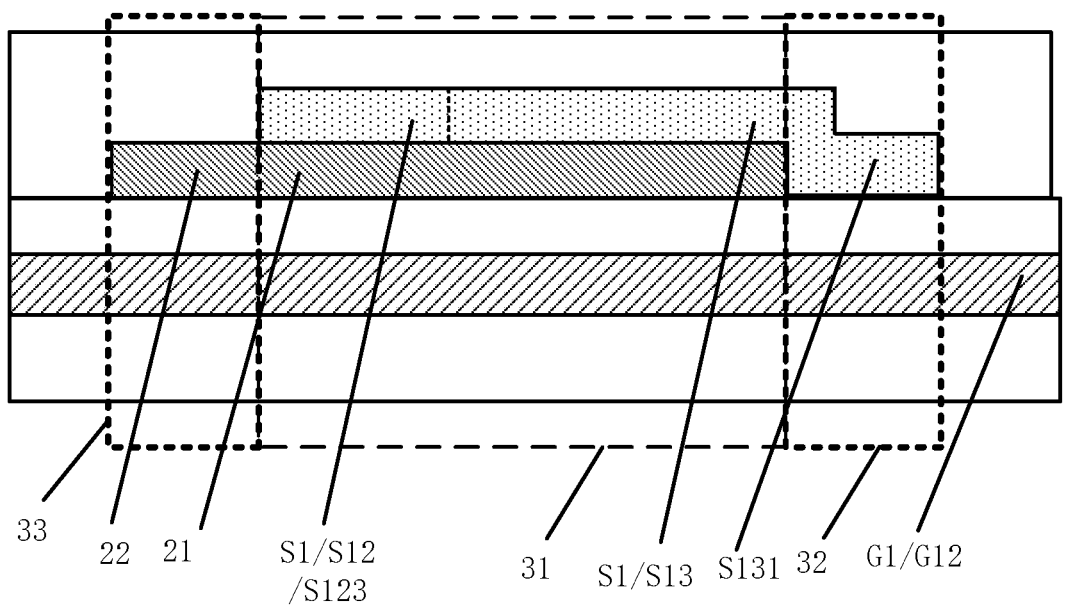
FIG. 14 illustrates a cross-sectional view of the display panel in FIG. 13 along an F-F' direction.

FIG. 13 illustrates another enlarged view of a B part of the display panel in FIG. 1; and FIG. 14 illustrates a cross-sectional view of the display panel in FIG. 13 along an F-F' direction. As illustrated in FIG. 1, FIGS. 4-5, and FIGS. 13-14, in one embodiment, the display panel may further include a plurality of second compensation units 22 in the first non-display region NA1. The plurality of second compensation units 22 may be made of a semiconductive material, and each of the plurality of second compensation units 22 may be insulated from each other. Along the direction perpendicular to the plane of the display panel, the plurality of second compensation units 22 may overlap the second wiring portions G12 while may not overlap the first data lines S1. Overlapping portions between the plurality of second compensation units 22 and the second wiring portions G12 may form third compensation units 33.

In the present embodiment, the plurality of second compensation units 22 may be disposed in the first non-display region NA1. Along the direction perpendicular to the plane of the display panel, the plurality of second compensation units 22 may overlap the second wiring portions G12 while may not overlap the first data lines S1. Overlapping portions between the plurality of second compensation units 22 and the second wiring portions G12 may form third compensation units 33. In each of the third compensation units 33, when the corresponding one of the second wiring portions G12 transmit voltage signals, induced charges may be generated at a surface of corresponding one of the plurality of second compensation units 22, and the surface of the corresponding one of the plurality of second compensation units 22 may be converted into an electron accumulation layer from a depletion layer, to form an inversion layer. Correspondingly the corresponding one of the plurality of second compensation units 22 may have a certain carrier concentration and may be conductive.

Loads of the third compensation units 33 may be close or equal to loads formed by a portion of the active layers T4 in the thin film transistors T overlapping the plurality of gate lines G or the gates T1 but not overlapping the plurality of data lines S or the sources T2. Correspondingly, a difference of the loads in the display panel and a difference of the scan delay in the display panel because of a difference between a number of the thin film transistors T connected to the first gate lines G1 and a number of the thin film transistors connected to the second gate lines G2 may be reduced further by disposing the third compensation units 33. A displaying uniformity of the display panel and then a product quality may be improved further.

For description purposes only, the embodiment illustrated in FIGS. 13-14 where the plurality of first compensation units 21 and the plurality of second compensation units 22 are connected to each other and are disposed in a same layer is used as an example to describe the present disclosure, and should not limit the scopes of the present disclosure. In some other embodiments, the plurality of first compensation units 21 and the plurality of second compensation units 22 may be insulated from each other. In some other embodiments, the plurality of first compensation units 21 and the plurality of second compensation units 22 may be disposed in different film layers of the display panel.

In one embodiment illustrated in FIG. 1 and FIGS. 13-14, an orthographic projection of each of the plurality of second compensation units 22 on the plane of the display panel may be located in an orthographic projection of corresponding one of the second wiring portions G12 on the plane of the display panel.

In the present disclosure, the overlapping portions between the plurality of second compensation units 22 and the second wiring portions G12 may form the third compensation units 33. An orthographic projection of each of the plurality of second compensation units 22 on the plane of the display panel may be located in an orthographic projection of corresponding one of the second wiring portions G12 on the plane of the display panel. A portion of the orthographic projection of each of the plurality of second compensation units 22 on the plane of the display panel located outside the orthographic projection of corresponding one of the second wiring portions G12 on the plane of the display panel may be avoided. Since the portion of the orthographic projection of each of the plurality of second compensation units 22 on the plane of the display panel located outside the orthographic projection of corresponding one of the second wiring portions G12 on the plane of the display panel is unnecessary for forming the third compensation units 33, a production cost may be reduced.

As illustrated in FIG. 1, FIGS. 4-5 and FIGS. 13-14, in one embodiment, in each of the thin film transistors T, along the direction perpendicular to the plane of the display panel, an orthographic projection of a portion of the active layer T4 overlapping the plurality of gate lines G or the gate T1 but not overlapping the plurality of data lines S or the source T2 simultaneously on the plane of the display panel may have an area S-3.

In each of the third compensation units 33, the orthographic projection of corresponding one of the plurality of second compensation units 22 on the plane of the display panel may have an area s3. In one embodiment, $0 < S-3 = s3$.

In the present embodiment, an orthographic projection of each of the plurality of second compensation units 22 on the plane of the display panel may be located in an orthographic projection of corresponding one of the second wiring portions G12 on the plane of the display panel, and the overlapping portions between the plurality of second compensation units 22 and the second wiring portions G12 may form the third compensation units 33. The loads of the third compensation units 33 may be close or equal to the loads formed by a portion of the active layers T4 in the thin film transistors T overlapping the plurality of gate lines G or the gates T1 but not overlapping the plurality of data lines S or the sources T2. Correspondingly, a difference of the loads in the display panel and a difference of the scan delay in the display panel because of a difference between a number of the thin film transistors T connected to the first gate lines G1 and a number of the thin film transistors connected to the second gate lines G2 may be reduced further by disposing the third compensation units 33. A displaying uniformity of the display panel and then a product quality may be improved further.

The present disclosure may also provide a display device including a display panel provided by the above embodiments of the present disclosure.

Figure 15:
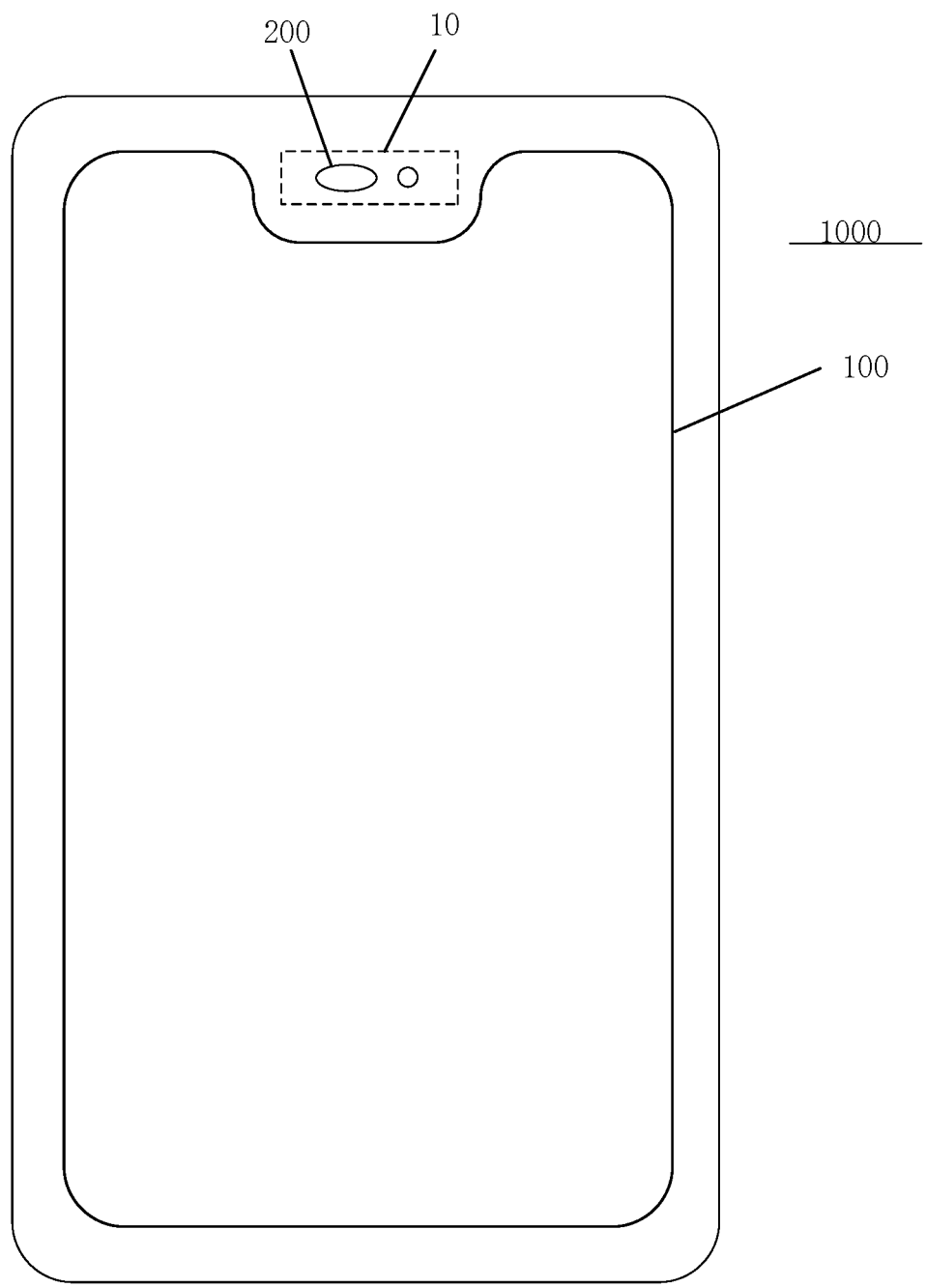
FIG. 15 illustrates an exemplary display device consistent with various disclosed embodiments in the present disclosure.

As illustrated in FIG. 15 showing a display device consistent with various embodiments of the present disclosure, in one embodiment, the display device 1000 may include a display panel 100 provided by above embodiments of the present disclosure. For description purposes only, the embodiment illustrated in FIG. 15 where the display device is a cell phone is used as an example to illustrate the present disclosure and should not limit the scopes of the present disclosure. In various embodiments, the display device may be a computer, a television, a vehicle display device, and/or any other display devices with a display function. In the present disclosure, the display device may have beneficial effects of the display panel provided by various embodiments of the present disclosure which can be referred to the above descriptions.

In one embodiment, as illustrated in FIG. 15, the display device 1000 may further include a camera device 200 in a notch 10.

In the present embodiment, the display panel 100 may include a notch 10. The camera device 200 of the display device may be disposed in the notch 10, to highly integrate the camera device 200 of the display device with the display panel 100.

In the display panel and display device provided by various embodiments of the present disclosure, a portion of the connection lines may include the first portions in the first display region. Correspondingly, a portion of the connection lines may include wires in the notch non-display region and the first portions in the first display region. By disposing a portion of the portions of the connection lines in the display region, a space occupied by the connection lines in the notch non-display region may be reduced and a narrow notch non-display region may be achieved.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments but may be embodied in other equivalent forms without departing from the scope of the present disclosure, which is determined by the appended claims.

What is claimed is:

1. A display panel, comprising:
a display region;
a non-display region surrounding the display region;
at least one notch;
a plurality of gate lines;
a plurality of data lines; and
a plurality of first compensation parts;

wherein:
the display region includes a first edge portion;
the first edge portion includes a first sub-edge portion and the first sub-edge portion is recessed toward an inside of the display region to form the at least one notch;
a portion of the first edge portion except the first sub-edge portion extends along a first direction;
the non-display region includes a first non-display region surrounding the at least one notch;
the plurality of gate lines includes first gate lines;
each of the first gate lines includes a first wiring portion and a second wiring portion connected to each other;
the first wiring portions are disposed in the display region and extend along the first direction;
the second wiring portions are disposed in the first non-display region;
the plurality of data lines includes first data lines;
each of the first data lines includes a first sub-portion, a second sub-portion, and a third sub-portion connected to each other;
the first sub-portions are disposed in the display region, and the second sub-portions and the third sub-portions are disposed in the first non-display region;
the first sub-portions and the second sub-portions extend along a second direction wherein the second direction intersects the first direction;
the third sub-portions extend along a direction same as an extending direction of the second wiring portions;
along a direction perpendicular to a plane of the display panel, the third sub-portions overlap the second wiring portions;
the plurality of first compensation parts is disposed in the first non-display region, and the plurality of first compensation parts is made of a semiconductive material;
each of the plurality of first compensation parts is insulated from others of the plurality of first compensation parts;
along the direction perpendicular to the plane of the display panel, the plurality of first compensation parts overlaps the second wiring portions and the plurality of first compensation parts overlaps the first data lines; and
overlapping portions of the plurality of first compensation parts, the second wiring portions, and the first data lines form first compensation units.

2. The display panel according to claim 1, wherein:
an orthographic projection of each of the plurality of first compensation parts on the plane of the display panel is located in an orthographic projection of corresponding one of the second wiring portions on the plane of the display panel, and is same as an orthographic projection of corresponding one of the third sub-portions on the plane of the display panel;
along the direction perpendicular to the plane of the display panel, the second sub-portions overlap the second wiring portions and do not overlap the plurality of first compensation parts; and
overlapping portions between the second sub-portions and the second wiring portions form second compensation units.

3. The display panel according to claim 1, wherein:
an orthographic projection of each of the plurality of first compensation parts on the plane of the display panel is located in an orthographic projection of corresponding one of the second wiring portions on the plane of the display panel;
an orthographic projection of each of the third sub-portions on the plane of the display panel is located in an orthographic projection of corresponding one of the plurality of first compensation parts on the plane of the display panel;
each of the second sub-portions includes a first subsection and a second subsection;
along the direction perpendicular to the plane of the display panel, the plurality of first compensation parts overlap the first subsections, and the second subsections overlap the second wiring portions but do not overlap the plurality of first compensation parts; and
overlapping portions between the second subsections and the second wiring portions form second compensation units.

4. The display panel according to claim 1, wherein:
an orthographic projection of each of the plurality of first compensation parts on the plane of the display panel is located in an orthographic projection of corresponding one of the second wiring portions on the plane of the display panel;
each of the second sub-portions includes a third subsection;
an orthographic projection of each of the third subsections on the plane of the display panel is located in an orthographic projection of corresponding one of the plurality of first compensation parts on the plane of the display panel;
each of the third sub-portions includes a fourth subsection;
along the direction perpendicular to the plane of the display panel, the fourth subsections overlap the second wiring portions but do not overlap the plurality of first compensation parts; and
overlapping portions between the fourth subsections and the second wiring portions form second compensation units.

5. The display panel according to claim 1, further including a plurality of pixel units arranged in an array in the display region, wherein:
the plurality of gate lines further includes second gate lines disposed in the display region and extending along the first direction;
the plurality of data lines further includes second data lines extending along the second direction;
along the direction perpendicular to the plane of the display panel, the second data lines overlap the first wiring portions;
each of the plurality of pixel units is electrically connected to at least one of the second gate lines or the first wiring portions;
each of the plurality of pixel units is electrically connected to at least one of the second data lines or the first sub-portions;
each of the plurality of pixel units includes a thin film transistor and a pixel electrode;
in each of the plurality of pixel units, the thin film transistor includes a gate, a source, a drain, and an active layer; and
in the thin film transistor of each of the plurality of pixel units, the source is electrically connected to corresponding one of the plurality of data lines, the gate is electrically connected to corresponding one of the plurality of gate lines and the drain is electrically connected to the pixel electrode.

6. The display panel according to claim 5, wherein:
the first non-display region includes a plurality of third-sub-portion rows, a plurality of third-sub-portion columns, a plurality of first-compensation-part rows, and a plurality of first-compensation-part columns;
each of the plurality of third-sub-portion rows includes a plurality of the third sub-portions arranged along the extending direction of the second wiring portions;
each of the plurality of third-sub-portion columns includes a plurality of the third sub-portions arranged along an extending direction of the second sub-portions;
each of the plurality of first-compensation-part rows includes a portion of the plurality of first compensation parts arranged along the extending direction of the second wiring portions;
each of the plurality of first-compensation-part columns includes another portion of the plurality of first compensation parts arranged along the extending direction of the second sub-portions;
a number of the plurality of third-sub-portion rows, a number of the plurality of first-compensation-part rows, and a number of the second wiring portions are same; and
a number of the plurality of third-sub-portion columns, a number of the plurality of first-compensation-part columns, and a number of the second sub-portions are same.

7. The display panel according to claim 5, wherein:
in each of the thin film transistors and along the direction perpendicular to the plane of the display panel, an orthographic projection of a portion of the active layer which overlaps the plurality of gate lines or the gate and overlaps the plurality of data lines or the source simultaneously on the plane of the display panel has an area S1;
in each of the first compensation units and along the direction perpendicular to the plane of the display panel, an orthographic projection of a portion of corresponding one of the plurality of first compensation parts which overlaps corresponding one of the second wiring portions and corresponding one of the first data lines simultaneously on the plane of the display panel has an area s1; and $0 < S1 = s1.$ 8. The display panel according to claim 5, wherein:
in each of the thin film transistors and along the direction perpendicular to the plane of the display panel, an orthographic projection of a portion of the source which overlaps the plurality of gate lines or the gate but does not overlap the active layer on the plane of the display panel has an area S2;
in each of the second compensation units and along the direction perpendicular to the plane of the display panel, an orthographic projection of a portion of corresponding one of the first data lines which overlaps corresponding one of the second wiring portions but does not overlap corresponding one of the plurality of first compensation parts on the plane of the display panel has an area s2; and $0 < S2 = s2.$ 9. The display panel according to claim 5, further including a plurality of second compensation parts in the first non-display region, wherein:
the plurality of second compensation parts is made of a semiconductive material and is insulated from each other;
along the direction perpendicular to the plane of the display panel, the plurality of second compensation parts overlaps the second wiring portions and does not overlap the first data lines; and
overlapping portions between the plurality of second compensation parts and the second wiring portions form third compensation units.

10. The display panel according to claim 9, wherein an orthographic projection of each of the plurality of second compensation parts on the plane of the display panel is located in an orthographic projection of corresponding one of the second wiring portions on the plane of the display panel.

11. The display panel according to claim 10, wherein:
in each of the thin film transistors and along the direction perpendicular to the plane of the display panel, an orthographic projection of a portion of the active layer which overlaps the plurality of gate lines or the gate but does not overlap the plurality of data lines or the source simultaneously on the plane of the display panel has an area S3;
in each of the third compensation units, an orthographic projection of corresponding one of the plurality of second compensation parts on the plane of the display panel has an area s3; and $0 < S3 = s3.$ 12. The display panel according to claim 1, wherein:
along the second direction, a width of the plurality of first compensation parts, a width of the third sub-portions, and a width of the second wiring portions are same.

13. A display device, comprising a display panel, wherein, the display panel includes a display region, a non-display region surrounding the display region, at least one notch, a plurality of gate lines, a plurality of data lines, and a plurality of first compensation parts, wherein:
the display region includes a first edge portion;
the first edge portion includes a first sub-edge portion and the first sub-edge portion is recessed toward an inside of the display region to form the at least one notch;
a portion of the first edge portion except the first sub-edge portion extends along a first direction;
the non-display region includes a first non-display region surrounding the at least one notch;
the plurality of gate lines includes first gate lines;
each of the first gate lines includes a first wiring portion and a second wiring portion connected to each other;
the first wiring portions are disposed in the display region and extend along the first direction;
the second wiring portions are disposed in the non-display region;
the plurality of data lines includes first data lines;
each of the first data lines includes a first sub-portion, a second sub-portion, and a third sub-portion connected to each other;
the first sub-portions are disposed in the display region, and the second sub-portions and the third sub-portions are disposed in the first non-display region;

the first sub-portions and the second sub-portions extend along a second direction wherein the second direction intersects the first direction;
the third sub-portions extend along a direction same as an extending direction of the second wiring portions;
along a direction perpendicular to a plane of the display panel, the third sub-portions overlap the second wiring portions;
the plurality of first compensation parts is disposed in the first non-display region and is made of a semiconductive material;
each of the plurality of first compensation parts is insulated from other first compensation parts of the plurality of first compensation parts;
along the direction perpendicular to the plane of the display panel, the plurality of first compensation parts overlaps the second wiring portions and the first data lines; and
overlapping portions between the plurality of first compensation parts, the second wiring portions, and the first data lines form first compensation units.

14. The display device according to claim 13, further including a camera device disposed in the at least one notch.

15. The display device according to claim 13, wherein:
an orthographic projection of each of the plurality of first compensation parts on the plane of the display panel is located in an orthographic projection of corresponding one of the second wiring portions on the plane of the display panel, and is same as an orthographic projection of corresponding one of the third sub-portions on the plane of the display panel;
along the direction perpendicular to the plane of the display panel, the second sub-portions overlap the second wiring portions and do not overlap the plurality of first compensation parts; and
overlapping portions between the second sub-portions and the second wiring portions form second compensation units.

16. The display device according to claim 13, wherein:
an orthographic projection of each of the plurality of first compensation parts on the plane of the display panel is located in an orthographic projection of corresponding one of the second wiring portions on the plane of the display panel;
an orthographic projection of each of the third sub-portions on the plane of the display panel is located in an orthographic projection of corresponding one of the plurality of first compensation parts on the plane of the display panel;
each of the second sub-portions includes a first subsection and a second subsection;
along the direction perpendicular to the plane of the display panel, the plurality of first compensation parts overlap the first subsections, and the second subsections overlap the second wiring portions but do not overlap the plurality of first compensation parts; and
overlapping portions between the second subsections and the second wiring portions form second compensation units.

17. The display device according to claim 13, wherein:
an orthographic projection of each of the plurality of first compensation parts on the plane of the display panel is located in an orthographic projection of corresponding one of the second wiring portions on the plane of the display panel;
each of the second sub-portions includes a third subsection;

an orthographic projection of each of the third subsections on the plane of the display panel is located in an orthographic projection of corresponding one of the plurality of first compensation parts on the plane of the display panel;
each of the third sub-portions includes a fourth subsection;
along the direction perpendicular to the plane of the display panel, the fourth subsections overlap the second wiring portions but do not overlap the plurality of first compensation parts; and
overlapping portions between the fourth subsections and the second wiring portions form second compensation units.

18. The display device according to claim 13, further including a plurality of pixel units arranged in an array in the display region, wherein:
the plurality of gate lines further includes second gate lines disposed in the display region and extending along the first direction;
the plurality of data lines further includes second data lines extending along the second direction;
along the direction perpendicular to the plane of the display panel, the second data lines overlap the first wiring portions;
each of the plurality of pixel units is electrically connected to at least one of the second gate lines or the first wiring portions;
each of the plurality of pixel units is electrically connected to at least one of the second data lines or the first sub-portions;
each of the plurality of pixel units includes a thin film transistor and a pixel electrode;
in each of the plurality of pixel units, the thin film transistor includes a gate, a source, a drain, and an active layer; and
in the thin film transistor of each of the plurality of pixel units, the source is electrically connected to corresponding one of the plurality of data lines, the gate is electrically connected to corresponding one of the plurality of gate lines and the drain is electrically connected to the pixel electrode.

19. The display device according to claim 13, wherein:
along the second direction, a width of the plurality of first compensation parts, a width of the third sub-portions, and a width of the second wiring portions are same.

20. The display device according to claim 19, wherein:
the first non-display region includes a plurality of third-sub-portion rows, a plurality of third-sub-portion columns, a plurality of first-compensation-part rows, and a plurality of first-compensation-part columns;
each of the plurality of third-sub-portion rows includes a plurality of the third sub-portions arranged along the extending direction of the second wiring portions;
each of the plurality of third-sub-portion columns includes a plurality of the third sub-portions arranged along an extending direction of the second sub-portions;
each of the plurality of first-compensation-part rows includes a portion of the plurality of first compensation parts arranged along the extending direction of the second wiring portions;
each of the plurality of first-compensation-part columns includes another portion of the plurality of first compensation parts arranged along the extending direction of the second sub-portions;

a number of the plurality of third-sub-portion rows, a number of the plurality of first-compensation-part rows, and a number of the second wiring portions are same; and a number of the plurality of third-sub-portion columns, a number of the plurality of first-compensation-part columns, and a number of the second sub-portions are same.

* * * * *